United States Patent [19]

Meier et al.

[11] Patent Number: 5,286,611
[45] Date of Patent: Feb. 15, 1994

[54] PHOTORESIST

[75] Inventors: Kurt Meier, Therwil, Switzerland; Robert J. Lunn, Bar Hill, England; Christoph Kroehnke, Freiburg/Munzingen, Fed. Rep. of Germany; Giuliano Eugster, Itingen, Switzerland

[73] Assignee: Ciba-Geigy Corporation, Ardsley, N.Y.

[21] Appl. No.: 916,933

[22] Filed: Jul. 20, 1992

[30] Foreign Application Priority Data

Jun. 16, 1989 [CH] Switzerland ............... 2254/89

[51] Int. Cl.$^5$ ................................. G03C 1/727
[52] U.S. Cl. ....................... 430/325; 430/330
[58] Field of Search ...................... 430/325, 330

[56] References Cited

U.S. PATENT DOCUMENTS 4,621,043 11/1986 Gervay.
4,961,960 10/1990 Iimure ..................... 522/96 X

FOREIGN PATENT DOCUMENTS 0287019 10/1988 European Pat. Off..
0292219 11/1988 European Pat. Off..
54-132633 10/1979 Japan.
2175908 12/1986 United Kingdom.

*Primary Examiner*—Jack P. Brammer
*Attorney, Agent, or Firm*—William A. Teoli, Jr.

[57] ABSTRACT

Photocurable and solvent-developable compositions based on photopolymerizable (meth)acrylates, a photoinitiator for (meth)acrylates, an organic polymeric binder which comprises free carboxyl groups and has an acid number of at least 60, a blocked polyisocyanate crosslinking agent which has a cleavage temperature of at least 100° C., and an inert solvent in an amount such that the photocurable composition is pourable, are described.

13 Claims, No Drawings

PHOTORESIST

The present invention relates to novel, developable photoresist compositions which are suitable, in particular, as solder resists.

Solvent-free photocurable compositions based on compounds which can be polymerized by means of free radicals and on blocked isocyanates are disclosed in JP-A-54/132,633. These compositions are applied in structured form to a substrate and subsequently cured using UV radiation. They can be used, inter alia, as solder resists. Developable systems are not described therein. Resists applied in structured form generally have lower resolution than developable resists.

EP-A-115,354 discloses (meth)acrylate-based photoresists which contain an aldehyde condensation resin precursor as crosslinking agent and a selected binder containing acid groups. These compositions have a long shelf life at room temperature and can be cured, on the other hand, at temperatures which are relatively low for resists of this type.

Photoresists are generally applied to a substrate by lamination or from solution. In these process steps, the resist is usually warmed, for example during the lamination operation or during the evaporation of the solvent after application from solution. Partial crosslinking generally takes place even before the photostructuring. This can result in an impairment of the image quality, since partial crosslinking has occurred even in the unexposed areas. It is thus a desirable property of the photoresist that it undergoes as little chemical change as possible due to this heat treatment. On the other hand, it is desirable that a photoresist is cured rapidly and at the lowest possible temperatures after application and imagewise exposure in order that a high throughput in the apparatuses used with simultaneous saving of energy costs is achieved.

It has now been found that the known photocurable compositions can be modified by using selected binders and crosslinking agents in a manner such that a developable photoresist is obtained which has a long shelf life, is simple to process from solution and using which high-resolution images can be achieved and which is distinguished by low brittleness and high heat and chemical resistance after thermal curing.

Compared with solder resists cured using hexamethoxymethylmelamine, the resists according to the invention are distinguished, surprisingly, by higher latency. Thus, coatings of these resists can be applied even from relatively high-boiling solvents and subsequently dried quickly at temperatures of above 100° C. The number of solvents available for coating is thus increased; in particular, non-halogenated solvents can be employed. For certain coating methods, relatively high-boiling solvents must be used, for example in curtain coating or screen printing.

The present invention relates to a photocurable and solvent-developable composition comprising a) a photopolymerizable acrylate or methacrylate,
b) a photoinitiator for component a),
c) a polymeric organic binder which comprises free carboxyl groups and has an acid number of at least 60,
d) as crosslinking agent, a blocked polyisocyanate which has a cleavage temperature of at least 100° C., and
e) an inert solvent in an amount such that the photocurable composition is pourable.

Components a) to e) can each be in the form of individual compounds. However, it is also possible to employ mixtures of several of these components, for example mixtures of several (meth)acrylates.

Component a) may be a monomeric or oligomeric (meth)acrylate, so long as it is photopolymerizable, i.e. can be converted into crosslinked and insoluble products, in particular by UV and/or VIS radiation.

These are, in particular, compounds comprising two or more functional groups of the formula I

in which $R_1$ is hydrogen or methyl, X is $-NR_2-$ and in particular $-O-$, and $R_2$ is hydrogen or $C_1-C_8$alkyl.

Compounds comprising groups of the formula I are generally esters or amides based on aliphatic, cycloaliphatic, aromatic or araliphatic polyalcohols or polyamines.

Monomeric or oligomeric components a) are known per se to those skilled in the art of photoresists and are described, for example, in EP-A-115,354.

Preferred components a) are compounds of the formula II

in which A is a radical of the formula I, n is 2,3 or 4, and $R_3$ is the radical of an aliphatic or cycloaliphatic n-hydric alcohol after removal of the functional groups.

Examples of radicals $R_2$ are ethyl, n-propyl, isopropyl, n-butyl, sec-butyl, n-pentyl, n-hexyl, n-heptyl, n-octyl and, in particular, methyl.

Examples of aliphatic alcohols on which the radical $R_3$ is based are alkylenediols, such as 1,2-ethanediol, 1,2-propanediol, 1,3-propanediol, 1,4-butanediol, 1,5-pentanediol, 1,6-hexanediol, 1,8-octanediol, 1,10-decanediol, 1,12-dodecanediol, di- or triethylene glycol, tripropylene glycol, 2,2-dimethylolpropane; or trihydric aliphatic alcohols, such as trimethylolethane, trimethylolpropane, polyoxyethylated trimethylolpropane or glycerol; or tetrahydric alcohols, such as pentaerythritol.

Examples of cycloaliphatic alcohols on which the radical $R_3$ is based are 1,3- or 1,4-cyclohexanediol or 1,4-dimethylolcyclohexane.

In addition to the acrylate and/or methacrylate groups, particularly preferred components a) comprise additional functional radicals which are reactive to isocyanates, for example amino groups or, in particular, free carboxyl groups or alcohol groups. Examples of these are (meth)acrylates of the abovementioned polyalcohols, in which only some of the alcoholic radicals are esterified.

Photoinitiators b) which can be employed are all initiators customary per se for free-radical polymerization.

Examples of suitable photoinitiators b) are aromatic carbonyl compounds, for example benzoin, benzoin alkyl ethers, such as the isopropyl or n-butyl ethers, α-substituted acetophenones, in particular benzil ketals, such as benzil dimethyl ketal, or, in particular, α-halogenated acetophenones, such as trichloromethyl p-tert-butylphenyl ketone, or, in particular, α-amino-substituted acetophenones, such as dimethylaminomethyl phenyl ketone or morpholinomethyl phenyl ketone, or, in particular, dialkoxyacetophenones, such as diethoxyacetophenone, or, in particular, α-hydroxyacetophenones, such as 1-hydroxycyclohexyl phenyl ketone; or benzophenones, such as benzophenone itself or bis(4-dimethylamino)benzophenone; or metallocene initiators, such as titanocene initiators, for example bis(π-methylcyclopentadienyl)bis(σ-pentafluorophenyl)titanium(IV); or a stannane in combination with a photoreducible dye, for example trimethylbenzylstannane in combination with Methylene Blue or Bengal Pink; or a quinone or a thioxanthone in combination with an amine comprising at least one hydrogen atom on an α-C atom, such as anthraquinone, benzoquinone or thioxanthone in combination with bis(4-dimethylamino)benzophenone or triethanolamine; or a thioxanthone, for example an alkyl- or halogen-substituted thioxanthone, for example 2-isopropylthioxanthone or 2-chlorothioxanthone; or acylphosphine oxides.

Component c) can be various organic polymeric binders comprising free carboxyl groups, so long as they have an acid number of at least 60 and are thus soluble as such in a developer. To this end, the binder generally comprises lateral free carboxyl groups. Binders of this type are generally derived from polymerizable, ethylenically unsaturated monomers comprising free carboxyl groups. Examples of such monomers are acrylic acid, methacrylic acid, maleic acid or itaconic acid. These binders generally also comprise further comonomers without acidic groups, for example the esters or amides of the abovementioned acids or 1-alkenes or styrene.

The binders may also comprise free carboxyl groups and acrylate or methacrylate groups in the same molecule. These include, for example, products of the reaction of an epoxy(meth)acrylate with carboxylic anhydrides. Epoxy(meth)acrylate is to be understood as meaning product of the reaction of epoxy compounds, preferably based on novolaks or unmodified or modified bisphenol A, with acrylic acid or methacrylic acid. These epoxy(meth)acrylates are then reacted with carboxylic anhydrides, for example tetrahydrophthalic anhydride, hexahydrophthalic anhydride, pyromellitic dianhydride or benzophenonetetracarboxylic dianhydride. Polymeric binders of this type are described in EP-A-292,219 and GB-A-2,175,908.

Examples of further binders comprising free carboxyl groups and acrylate or methacrylate groups in the same molecule are products of the reaction of styrene-maleic anhydride copolymers with hydroxy(meth)acrylates, for example 2-hydroxyethyl(meth)acrylate or 3-hydroxypropyl(meth)acrylate. Polymeric binders of this type are described in EP-A-287,019.

The polymeric binder c) generally has a molecular weight of from about 2000 to 500,000 (number average).

Preferred binders c) are those which are soluble in alkaline aqueous solvents. Photoresists which can be developed in aqueous solution can be formulated using binders of this type. Such resists are particularly preferred.

These particularly preferred binders c) include homopolymers based on acrylic acid, methacrylic acid, maleic acid or itaconic acid, copolymers based on acrylic acid, methacrylic acid, maleic acid or itaconic acid and styrene or esters of these acids, in particular the alkyl esters thereof.

Some of the binders to be used according to the invention are commercially available. Examples of these are polymers of the Carboset ® and Scripset ® type. Further suitable polymeric binders c) are described in EP-A-115,354.

The crosslinking agent d) used is a blocked polyisocyanate which has a cleavage temperature of at least 100° C., or a mixture of polyisocyanates of this type. In the context of this description, this is to be understood as meaning a blocked polyisocyanate in which at least half the isocyanate groups are re-liberated by deblocking at a temperature of 100° C. and are available for reaction with the isocyanate-reactive functional groups of the other components of the photoresist.

The polyisocyanate on which the blocked component d) is based may be any aliphatic, cycloaliphatic, aromatic or araliphatic compounds having at least two, preferably two to four, isocyanate groups which may have further substituents which are inert to isocyanate groups, such as alkyl or alkoxy groups or halogen atoms.

These include, for example, the following compounds: 2,4-diisocyanatotoluene, and technical-grade mixtures thereof with 2,6-diisocyanatotoluene, 2,6-diisocyanatotoluene, 1,5-diisocyanatonaphthalene, 4,4'-diisocyanatodiphenylmethane and technical-grade mixtures of various diisocyanatodiphenylmethanes (for example the 4,4'- and 2,4'-isomers), diisocyanato-m-xylylene, N,N'-di(4-methyl-3-isocyanotophenyl)urea, 1,6-diisocyanatohexane, 3,5,5-trimethyl-1-isocyanatomethylcyclohexane(isophorone diisocyanate), trimethyl-1,6-diisocyanatohexane, 1-methyl-2,4-diisocyanatocyclohexane, dimeryl diisocyanate, triisocyanatotriphenylmethane and 4,4'-diisocyanatodicyclohexylmethane.

These polyisocyanates may be blocked by various radicals. Examples of suitable blocking components are β-dicarbonyl compounds, such as malonates, acetoacetates or 2,4-pentanedione, or hydroxamates, triazoles, imidazoles, imidazolides, tetrahydropyrimidines, lactams, oximes, hydroxyimides, such as N-succinimide, or phenols or thiophenols.

Component d) may also be a urethanized, carbodiimidated or dimerized or trimerized polyisocyanate or other forms of polyisocyanates which are inactive below 100° C., so long as their cleavage temperature is above 100° C. Examples of these are urethanized 4,4'-diisocyanatodiphenylmethane, carbodiimidated 4,4'-diisocyanatodiphenylmethane, the uretdione of 2,4-diisocyanatotoluene, the trimer of diisocyanatotoluene, N,N',N''-tri(6-isocyanatohexyl)biuret, 2,2,4-trimeric isophorone diisocyanate and trimeric hexane diisocyanates.

Preferred components d) have a cleavage temperature between 100° and 160° C. Particularly preferred components d) are oxime-blocked polyisocyanates, in particular diisocyanates.

The inert solvent e) must dissolve components a) to e) and is employed in an amount such that the photocurable composition is pourable. The solvent should not have an adverse effect on the shelf life of the mixture and must therefore be substantially inert to the mixture components. Furthermore, it should have the lowest evaporation point possible in order that it may easily be removed after application of the photoresist to the substrate. Examples of suitable solvents are hydrocarbons, such as aliphatic hydrocarbons, for example trichloroethane; or aromatic hydrocarbons, such as dichlorobenzene; or esters, such as methyl glycol acetate, methoxypropyl acetate or ethyl 3-ethoxypropionate; or ketones, such as diisopropyl ketone or cyclohexanone; or alcohols, such as methyl glycol or methoxypropanol; or lactones, such as γ-butyrolactone; or lactams, such as N-methylpyrrolidone.

The amount of the individual components of the compositions according to the invention may be varied within broad limits depending on the nature and area of application of the radiation-sensitive mixture. The following weight data in each case relate to the total weight of components a) to e), unless otherwise stated.

The amount of polymerizable monomer or monomer mixture a) is generally 1–50% by weight, preferably 10–30% by weight.

The amount of initiator component b) is generally 1–30% by weight, in particular 5–20% by weight, based on the total weight of component a).

The amount of binder c) is generally 10–70% by weight, preferably 10–50% by weight.

The amount of crosslinking agent d) is generally 2–20% by weight, preferably 5–15% by weight.

The amount of solvent e) is generally 5–80% by weight, in particular 15–60% by weight.

The compositions according to the invention may comprise further additives which are customary per se, for example stabilizers, sensitizers, pigments, dyes, fillers, coupling agents, flow-control agents, wetting agents and plasticizers. The amount of such additives is usually 0.01–50% by weight, based on the total composition.

The compositions according to the invention are highly suitable as coating agents for substrates of all types, for example wood, textiles, paper, ceramics, glass, plastics, such as polyesters, polyolefins, cellulose acetate or epoxy resins, in particular glass fibre-reinforced epoxy resins, and for metals, such as Al, Cu, Ni, Fe, Zn, Mg or Co, or for semiconductor materials, such as Si, GaAs or Ge, or for insulator materials, such as $Si_3N_4$ or $SiO_2$, in which an image or a protective coating is to be applied by exposure.

The invention also relates to a process for the production of relief structures comprising the steps:
i) application of the composition according to the invention to a substrate surface,
ii) drying of the coated substrate by evaporation of the majority of the solvent e), preferably by heating the coated substrate, so that the solvent e) is substantially removed and a tack-free surface is produced,
iii) image-wise irradiation of the photosensitive coating with actinic radiation, so that the irradiated areas of the coating photopolymerize and become less soluble than the non-irradiated areas of the coating,
iv) removal of the non-irradiated areas of the coating by treating the coating with a solvent for the composition according to the invention, preferably with an alkaline aqueous developer,
v) heating the developed coating to temperatures above the cleavage temperature of the blocked polyisocyanate d) in order to thoroughly crosslink the irradiated composition.

The coated substrates can be produced, for example, by preparing a solution or suspension of the composition according to the invention. This is generally applied uniformly to a substrate by coating methods which are known per se. Examples of coating methods are spin coating, dipping, knife coating, curtain coating, brushing, spraying and reverse-roll coating.

The amount applied (coating thickness) and the type of substrate (coating base) depends on the desired area of application. It is particularly advantageous that the compositions according to the invention can be applied in thin coatings and are distinguished by good resolution. If the radiation source and radiation-sensitive components are chosen appropriately, they are suitable for a broad range of areas of application where the production of structured images is desired.

However, their use is particularly advantageous in the production of printed circuit boards as photostructurable solder resist or as permanent resist. These uses are likewise subject-matter of the present invention.

After the coating operation, the solvent is usually removed by drying, giving an amorphous coating of the resist on the base. The film thicknesses after drying are preferably 5–150 μm. The drying is usually carried out at elevated temperatures, which are usually selected so that no substantial deblocking of component d) takes place. The solvent can also be removed by applying a vacuum.

The radiation-sensitive coating is subsequently exposed in a manner known per se to radiation in order to photopolymerize component a). This is generally carried out image-wise. As a consequence of photopolymerization of component a), the solubility is reduced at the exposed areas of the coating compared with the unexposed areas, so that differentiation of the surface becomes possible.

The compositions according to the invention are exposed using actinic radiation. This is generally UV and/or VIS radiation. Radiation in the range from about 220–450 nm is preferred. Irradiation can be effected using all radiation sources which are known per se, for example mercury high-pressure lamps or UV/VIS lasers. The process parameters, for example irradiation duration and separation of radiation source and photosensitive coating, will generally depend on the nature of the radiation-sensitive composition and on the desired properties of the coating and can be established by those skilled in the art on the basis of routine experiments. The image-wise exposure can take place through a photomask or by direct writing of a laser beam on the photosensitive coating.

The exposure is followed by a development step. The action of a developer removes the unexposed areas of the photoresist. Virtually any solvent for the unexposed composition in which the irradiated and partially cured composition is insoluble or only partially soluble is suitable as developer.

Alkaline aqueous solutions are preferred as developers. These include, in particular, solutions of alkali metal carbonates, hydroxides, silicates and phosphates. These solutions may also comprise relatively small amounts of wetting agents and/or organic solvents.

Aqueous solutions of alkali metal carbonates, for example 1% sodium carbonate solution, are particularly preferred.

Development using organic solvents is likewise possible. Examples of suitable solvents are ketones, such as cyclohexanone, acetone or methyl ethyl ketone, or alcohols, such as 2-ethoxyethanol, diacetone alcohol or diethylene glycol monobutyl ether.

After exposure and development, the coating is subjected to thermal aftertreatment. To this end, the coating is heated to temperatures such that the crosslinking agent d) is deblocked and the liberated isocyanate groups react with the carboxyl groups of the binder c) and, if present, with further isocyanate-reactive radicals of component a). The temperature in this step must be above the cleavage temperature of the blocked polyisocyanate and is chosen depending on the component d) employed. In each case, the temperature in this step is greater than 100° C., preferably 120°-180° C.

I. SYNTHESIS OF THE PHOTORESIST BINDER POLYMER

Example 1

54.51 g (0.1125 mol) of the product of the reaction of bisphenol A diglycidyl ether with acrylic acid are dissolved in 131.7 g of dioxane. 0.87 g of di-tertiary-butyl-para-cresol and 32.2 g (0.1 mol) of benzophenonetetracarboxylic dianhydride are added to this solution at 70° C. When the reaction mixture has come to the boil, 246 mg (2 mmol) of 4-dimethylaminopyridine are added as catalyst. After the mixture has been refluxed for 26 hours, 2.25 equivalents of acid are found per kg of reaction product, and the reaction is terminated.

Example 2

54.51 g (0.1125 mol) of the product of the reaction of bisphenol A diglycidyl ether with acrylic acid are dissolved in 114 g of dioxane. 0.87 g of di-tertiary-butyl-para-cresol and 21.81 g (0.1 mol) of pyromellitic dianhydride are added to this solution at 70° C. When the reaction mixture has come to the boil, 246 mg (2 mmol) of 4-dimethylaminopyridine are added as catalyst. After the mixture has been refluxed for 24 hours, 2.55 equivalents of acid are found per kg of reaction product, and the reaction is terminated.

Example 3

87.7 g of the product of the reaction of an advanced bisphenol A diglycidyl ether (softening point 70°-80° C.) with acrylic acid, 45.6 g of tetrahydrophthalic anhydride and 0.12 g of hydroquinone are dissolved at room temperature in 180 ml of dioxane. 0.18 g of 4-dimethylaminopyridine are added, and the mixture is refluxed for 24 hours. The polymer is precipitated from water and dried. The yield is 100%.

Example 4

230 g of an epoxycresol novolak (epoxide value 4.35 eq./kg), 64.7 g of acrylic acid, 0.59 g of di-tertiary-butyl-para-cresol and 1.47 g of benzyldimethylamine are heated for 3.5 hours at 110° C. in 300 g of ethyl glycol acetate. During this time, the epoxide value drops to 0.3 eq./kg. 131.8 g of hexahydrophthalic anhydride and 1.05 g of 4-dimethylaminopyridine are subsequently added, and the mixture is boiled at 110° C. for a further 24 hours. 3.2 equivalents of acid are found per kg.

II. PREPARATION AND PROPERTIES OF THE PHOTORESIST

Example 5

A solution comprising 9.2 g of Scripset ® 550 (partially esterified copolymer based on styrene and maleic acid, from Monsanto), 7.9 g of Scripset ® 540 (partially esterified copolymer based on styrene and maleic acid, from Monsanto), 3.0 g of tetraethylene glycol dimethacrylate, 2.0 g of trimethylolpropane triacrylate, 8.4 g of Ultramix talc (Cyprus), 0.21 g of dye (Orasol Blue GN; CIBA-GEIGY), 3.2 g of pentaerythritol triacrylate, 1.5 g of 2-methyl-1-[4-(methylthio)phenyl]-2-morpholinopropan-1-one, 4.8 g of butan-2-one O,O'-[methylenebis(1,4-phenyleneiminocarbonyl)]dioxime, and 0.2 g of 4,4'-bis(diethylamino)benzophenone in 53.2 g of cyclohexanone is applied to a printed circuit board using a knife coater. The film is subsequently dried at 100° C. for 5 minutes. The coating obtained in this way is exposed through a mask for 15 seconds using a mercury high-pressure lamp (distance from sample bench: 50 cm). The exposed sample is developed in a 1% aqueous sodium carbonate solution and cured for one hour at 140° C. A coating having good solder bath resistance (1 minute at 270° C.) and a methylene chloride resistance of greater than 30 minutes is obtained.

Example 6

A solution comprising 45.6 g of the solution from Example 1 (18.3 g of solid), 8.8 g of a mixture of various acrylates (3.2 g of tetraethylene glycol dimethacrylate, 2.2 g of trimethylolpropane triacrylate and 3.4 g of pentaerythritol triacrylate), 9 g of Ultramix talc (Cyprus), 0.21 g of dye (Orasol Blue GN; CIBA-GEIGY), 1.6 g of 2-methyl-1-[4-(methylthio)phenyl]-2-morpholinopropan-1-one, 4.8 g of butan-2-one O,O'-[methylenebis(1,4-phenyleneiminocarbonyl)]dioxime, 0.21 g of 4,4'-bis(diethylamino)benzophenone and 0.2 g of FC-430 (3M Company) in 27.5 g of cyclohexanone is applied to a printed circuit board using a knife coater. The film is dried at 80° C. for 30 minutes, to give a coating thickness of approximately 40 μm. The coating obtained in this way is exposed through a mask for 30 seconds using a mercury high-pressure lamp (distance from the sample bench 50 cm). The exposed sample is developed in a 1% sodium carbonate solution in a spray developer (Convac, spraying pressure 3-4 bar) for 75 seconds. The exposed and developed board had a cross-hatch score of Gt0 (DIN 53151), and the pencil hardness is HB. Exposed and developed boards are additionally cured for one hour at 140° C. The cross-hatch test gives Gt0, pencil hardness 5H, resistance in methylene chloride >1 h and solder bath resistance >1 minute.

Example 7

A solution comprising 45.7 g of the solution from Example 2 (18.3 g of solid), 8.8 g of a mixture of various acrylates (3.2 g of tetraethylene glycol dimethacrylate, 2.2 g of trimethylolpropane triacrylate and 3.4 g of pentaerythritol triacrylate), 9 g of Ultramix talc (Cyprus), 0.21 g of dye (Orasol Blue GN; CIBA-GEIGY), 1.6 g of 2-methyl-1-[4-(methylthio)phenyl]-2-morpholinopropan-1-one, 4.8 g of butan-2-one O,O'-[methylenebis(1,4-phenyleneiminocarbonyl)]dioxime, 0.21 g of 4,4'-bis(diethylamino)benzophenone and 0.2 g of FC-430 (3M Company) in 27.4 g of cyclohexanone is applied to a printed circuit board using a knife coater. The film is dried at 80° C. for 30 minutes, to give a coating thickness of approximately 40 μm. The coating obtained in this way is exposed through a mask for 60 seconds using a mercury high-pressure lamp (distance from the sample bench 50 cm). The exposed sample is developed in a 1% sodium carbonate solution in a spray developer (Convac, spraying pressure 3-4 bar) for 45 seconds. The exposed and developed board had a cross-hatch score of Gt0 (DIN 53151), and the pencil hardness is HB. Exposed and developed boards are additionally cured for one hour at 140° C. The cross-hatch test gives Gt1, pencil hardness 7H, resistance in methylene chloride >1 h and solder bath resistance >1 minute.

Example 8

A solution comprising 18.3 g of the binder polymer from Example 3, 8.8 g of a mixture of various acrylates (3.2 g of tetraethylene glycol dimethacrylate, 2.2 g of trimethylolpropane triacrylate and 3.4 g of pentaerythritol triacrylate), 9 g of Ultramix talc, 0.21 g of dye (Orasol Blue GN; CIBA-GEIGY), 1.6 g of 2-methyl-1-[4-(methylthio)phenyl]-2-morpholinopropan-1-one, 4.8 g of butan-2-one O,O'-[methylenebis(1,4-phenyleneiminocarbonyl)]dioxime, 0.21 g of 4,4'-bis(diethylamino)benzophenone and 0.2 g of FC-430 (3M Company) in 27.5 g of cyclohexanone is applied to a printed circuit board using a knife coater. The film is dried at 80° C. for 15 minutes, to give a coating thickness of approximately 40 μm. The coating obtained in this way is exposed through a mask for 15 seconds using a mercury high-pressure lamp (distance from the sample bench 50 cm). The exposed sample is developed in a 1% sodium carbonate solution. The exposed and developed board had a cross-hatch score of Gt0 (DIN 53151), and the pencil hardness is HB. Exposed and developed boards are additionally cured for one hour at 140° C. The cross-hatch test gives Gt0, pencil hardness 3H, resistance in methylene chloride >1 h and solder bath resistance >10 seconds.

Example 9

A solution comprising 22.6 g of the solution from Example 4 (11.3 g of solid), 3.96 g of Scripset ® 550 (partially esterified copolymer based on styrene and maleic acid, from Monsanto), 3.96 g of Scripset ® 540 (partially esterified copolymer based on styrene and maleic acid, from Monsanto), 8.6 g of a mixture of various acrylates (2.3 g of tetraethylene glycol dimethacrylate, 2.1 g of trimethylolpropane triacrylate, 2.5 g of pentaerythritol triacrylate and 1.7 g of ethoxylated trimethylolpropane triacrylate), 7 g of Ultramix talc, 0.21 g of dye (Orasol Blue GN; CIBA-GEIGY), 1.6 g of 2-methyl-1-[4-(methylthio)phenyl]-2-morpholinopropan-1-one, 7.0 g of butan-2-one O,O'-[methylenebis(1,4-phenyleneiminocarbonyl)]dioxime, 0.21 g of 4,4'-bis(diethylamino)benzophenone and 0.2 g of FC-430 (3M Company) in 44.6 g of ethyl glycol ether acetate is applied to a printed circuit board using a knife coater. The film is dried at 80° C. for 15 minutes, to give a coating thickness of approximately 30 μm. The coating obtained in this way is exposed through a mask for 15 seconds using a mercury high-pressure lamp (distance from the sample bench 50 cm). The exposed sample is developed in a 1% sodium carbonate solution. The exposed and developed board had a cross-hatch score of Gt0 (DIN 53151), and the pencil hardness is HB. Exposed and developed boards are additionally cured for one hour at 140° C. The cross-hatch test gives Gt0, pencil hardness 3H, resistance in methylene chloride >1 h and solder bath resistance >1 minute.

What is claimed is:

1. A process for the production of relief structures comprising the steps:
   i) application to a substrate surface of a composition comprising:
      a) a photopolymerizable acrylate or methacrylate,
      b) a photoinitiator for component a),
      c) a polymeric organic binder which comprises free carboxyl groups and has an acid number of at least 60,
      d) as crosslinking agent, a blocked polyisocyanate which has a cleavage temperature of at least 100° C., and
      e) an inert solvent in an amount such that the photocurable composition is pourable;
   ii) drying of the coated substrate by evaporation of the majority of the solvent e) so that the solvent e) is substantially removed and a tack-free surface is produced,
   iii) image-wise irradiation of the photosensitive coating with actinic radiation, so that the irradiated areas of the coating photopolymerize and become less soluble than the non-irradiated areas of the coating,
   iv) removal of the non-irradiated areas of the coating by treating the coating with a solvent for the composition according to the invention,
   v) heating the developed coating to temperatures above the cleavage temperature of the blocked polyisocyanate d) in order to thoroughly crosslink the irradiated composition.

2. A process according to claim 1, wherein component a) is a compound of the formula II $$A-R_3-(A)_n \qquad (II)$$

in which n is 2, 3 or 4, $R_3$ is the radical of an aliphatic or cycloaliphatic n-hydric alcohol after removal of the OH groups, and A is a radical of the formula I $$\begin{matrix} R_1 & O \\ | & || \\ CH_2=CH-C-X- \end{matrix} \qquad (I)$$

in which $R_1$ is hydrogen or methyl, and X is —O—.

3. A process according to claim 1, wherein component a) additionally comprises functional radicals which are reactive towards isocyanates.

4. A process according to claim 1, wherein component b) is selected from the group consisting of benzoin, benzon alkyl ethers, α-substituted acetophenones, benzophenones, titanocene initiators, stannanes in combination with photoreducible dyes; quinones or thioxanthones in combination with amines which have at least one hydrogen atom on an α-C atom; thioxanthones and acylphosphine oxides.

5. A process according to claim 1, wherein component c) is soluble in an alkaline aqueous solvent.

6. A process according to claim 5 wherein component c) is a homopolymer of acrylic acid, methacrylic acid, maleic acid or itaconic acid; or component c) is a copolymer of acrylic acid, methacrylic acid, maleic acid or itaconic acid with styrene; or component c) is a copolymer of acrylic acid, methacrylic acid, maleic acid or itaconic acid with an ester of acrylic acid, methacrylic acid, maleic acid or itaconic acid.

7. A process according to claim 1, wherein component c) is a polymeric organic binder comprising free carboxyl groups and acrylic or methacrylic groups in the same molecule.

8. A process according to claim 1, wherein component d) is an aliphatic, cycloaliphatic, aromatic or araliphatic di-, tri- or tetraisocyanate compound whose isocyanate groups are blocked by β-dicarbonyl compounds, hydroxamates, triazoles, imidazoles, imidazolides, tetrahydropyrimidines, lactams, oximes, hydroxyimides, phenols or thiophenols.

9. A process according to claim 1, wherein component d) has a cleavage temperature between 100° and 160° C. and is an oxime-blocked polyisocyanate.

10. A process of claim 3, wherein said functional radicals are free carboxyl or alcohol groups.

11. A process of claim 4, wherein said α-substituted acetophenones are selected from the group consisting of α-halogenated-, α-amino-, α-alkoxy- and α-hydroxyacetophenones.

12. A process according to claim 1, wherein in step ii) the coated substrate is dried by heating said substrate so that the solvent e) is substantially removed and a tack-free surface is produced.

13. A process according to claim 1, wherein in step iv) the non-irradiated areas of the coating are removed by treating the coating with an alkaline aqueous developer.

* * * * *